United States Patent
Lee

(10) Patent No.: US 7,724,597 B2
(45) Date of Patent: May 25, 2010

(54) NONVOLATILE SEMICONDUCTOR MEMORY DEVICE HAVING DUMMY BIT LINE WITH MULTIPLE SECTIONS

(75) Inventor: Seung Jae Lee, Hwasung-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 144 days.

(21) Appl. No.: 11/526,015

(22) Filed: Sep. 25, 2006

(65) Prior Publication Data

US 2007/0070699 A1    Mar. 29, 2007

(30) Foreign Application Priority Data

Sep. 26, 2005   (KR) ............... 10-2005-0089188

(51) Int. Cl.
  *G11C 7/02* (2006.01)
(52) U.S. Cl. ............. 365/210.1; 365/185.2; 365/185.17
(58) Field of Classification Search ............ 365/185.01, 365/185.05, 185.17, 185.2
  See application file for complete search history.

(56) References Cited

U.S. PATENT DOCUMENTS

| 6,078,522 | A | 6/2000 | Park et al. |
| 6,687,177 | B2* | 2/2004 | Kurjanowicz .......... 365/189.09 |
| 6,914,813 | B2* | 7/2005 | Chevallier et al. ...... 365/185.05 |
| 7,136,314 | B2* | 11/2006 | You .......................... 365/201 |
| 2005/0237842 | A1* | 10/2005 | Takeuchi et al. ......... 365/225.7 |
| 2006/0083072 | A1* | 4/2006 | Umezawa .............. 365/185.29 |

FOREIGN PATENT DOCUMENTS

| JP | 11283363 | 10/1999 |
| KR | 10-1998-56186 | 9/1998 |
| KR | 10-1998-66731 | 10/1998 |

* cited by examiner

*Primary Examiner*—Vu A Le
*Assistant Examiner*—Han Yang
(74) *Attorney, Agent, or Firm*—Volentine & Whitt, PLLC

(57) ABSTRACT

A nonvolatile semiconductor memory device is disclosed having a dummy bit line formed from a plurality of dummy bit line sections. The particular dummy bit line sections are variously connected a common source line and a P-type well region.

7 Claims, 6 Drawing Sheets

NONVOLATILE SEMICONDUCTOR MEMORY DEVICE HAVING DUMMY BIT LINE WITH MULTIPLE SECTIONS

BACKGROUND OF THE INVENTION

1. Field of the Invention

Embodiments of the present invention relate generally to a nonvolatile semiconductor memory device. More particularly, embodiments of the invention relate to a nonvolatile semiconductor memory device having a dummy bit line.

This application claims priority to Korean Patent Application No. 10-2005-89188, filed on Sep. 26, 2005, the subject matter of which is hereby incorporated by reference in its entirety.

2. Description of the Related Art

Conventional nonvolatile semiconductor memory devices (hereafter, simply referred to as "memory device(s)") often incorporate an extra bit line that is not used for the transfer and storage of data, but is instead used to good effect during the fabrication of the semiconductor memory. This type of bit line is commonly referred to as a "dummy bit line." In one application, dummy bit lines serve as a connection medium of sorts. That is, certain wiring section(s) (e.g., upper sections) used to form the memory array matrix of the memory device are connected to other wiring sections (e.g., lower sections) through the dummy bit line.

In a more specific example, an upper wiring section (e.g., wiring located above the bit lines) is connected to a lower section (e.g., wiring located below the bit lines) through a dummy bit line, wherein the upper and lower wiring sections comprise a common source line. A source voltage is applied to "normal" memory cells (e.g., memory cells adapted to validly store data in the memory device), connected to normal bit lines (e.g., non-dummy bit lines) through the common source line. In conventional memory devices the voltage applied to the common source line tends to stabilize rather slowly. As a result, the voltage level on the common source line may drop when a normal bit line is used to sense the data stored in a corresponding memory cell.

Of further note, data from a selected normal memory cell is read in accordance with a voltage level on a corresponding normal bit line. Thus, during such read operations it is important to minimize the influence (e.g., coupling noise) of the surrounding wiring on the corresponding normal bit line in order to accurately read the data.

FIG. (FIG.) 1 is a diagram illustrating a portion of a conventional memory device cell array. FIG. 2 is a related layout illustrating normal bit lines (BLs), a dummy bit line (DBL), and a common source line (CSL), such as those show in FIG. 1. Referring collectively to FIGS. 1 and 2, a plurality of normal memory cells (MCs) is connected to the normal bit lines (BLs). Dummy memory cells (DMCs), which unlike normal memory cells are not adapted to store data, are connected to the dummy bit line (DBL). The dummy bit line (DBL) is arranged parallel with the normal bit lines (BLs) and have a similar length. Therefore, high coupling capacitance may be formed between the dummy bit line (DBL) and adjacent normal bit lines (BLs).

Additionally, in the conventional memory device, the dummy bit line (DBL) is connected to the common source line (CSL). (See, point PT11 of FIG. 1 and point PT11 in FIG. 2). In this case, when a normal bit line (BL) senses the data stored in a memory cell (MC), the voltage level on the dummy bit line (DBL) drops significantly. As a result, the voltage levels on normal bit lines adjacent to the dummy bit line (e.g., BL<1,1> and BL<2,1> in the illustrated example) also drop due to capacitive coupling effects. Due to this capacitive coupling effect induced voltage drop on normal bit lines (BLs) adjacent to the dummy bit line (DBL) in conventional memory devices, an OFF-state may be erroneously read (or detected) as a ON-state for a memory cell connected to the normal bit lines (BLs) adjacent to the dummy bit line (DBL).

SUMMARY OF THE INVENTION

Embodiments of the present invention address this problem, among others, and are adapted to provide memory devices having more stable (and accurate) read operations from normal bit lines adjacent to a dummy bit line.

Thus, in one embodiment, the invention provides a nonvolatile semiconductor memory device, comprising; a plurality of normal bit lines, each connecting normal memory cells, a dummy bit line arranged in parallel with the plurality of normal bit lines and connecting dummy cells, the dummy bit line comprising first and second dummy bit line sections, a common source line arranged to traverse the plurality of normal bit lines and the dummy bit line, and connected to the first dummy bit line section, and a well region formed proximate the normal memory cells and the dummy cells, wherein the second dummy bit line section is connected to at least one of a power supply line, a ground voltage line, and the well region.

In another embodiment, the invention provides a nonvolatile semiconductor memory device, comprising; a plurality of normal bit lines, each connecting normal memory cells, a well region formed proximate the normal memory cells and the dummy cells, and a dummy bit line, arranged in parallel with the plurality of normal bit lines, connecting dummy cells, and connected to the well region.

In yet another embodiment, the invention provides a nonvolatile semiconductor memory device, comprising; a plurality of normal bit lines, each connecting normal memory cells and having a defined length, a dummy bit line arranged between and in parallel with the plurality of normal bit lines and connecting dummy cells, the dummy bit line comprising upper, center, and lower dummy bit line sections, wherein the upper, center, and lower dummy bit line sections have a combined length substantially equal to the defined length, a common source line arranged to traverse the plurality of normal bit lines and the dummy bit line at substantially a mid-point along the defined length, and electrically connected to the center dummy bit line section via a contact hole, and a well region formed proximate the normal memory cells and the dummy cells and electrically connected to at least one of the upper, center, and lower dummy bit line sections.

BRIEF DESCRIPTION OF THE DRAWINGS

Several embodiments of the invention will be described with reference to the accompanying drawings. In the drawings and throughout the associated portions of the written description, like reference numerals indicate the same or similar components. In the drawings.

DESCRIPTION OF EXEMPLARY EMBODIMENTS

The designation convention introduced above will be used throughout the description that follows. For example, a memory cell adapted to validly store data will be referred to as a "normal memory cell" (MC). A cell connected to a dummy bit line and not adapted to store data will be called a "dummy memory cell" (DMC). A bit line connected to one or more normal memory cell(s) will be called a "normal bit line" (BL), while a bit line connected to only dummy memory cells will be called a "dummy bit line" (DBL).

Figure 1:
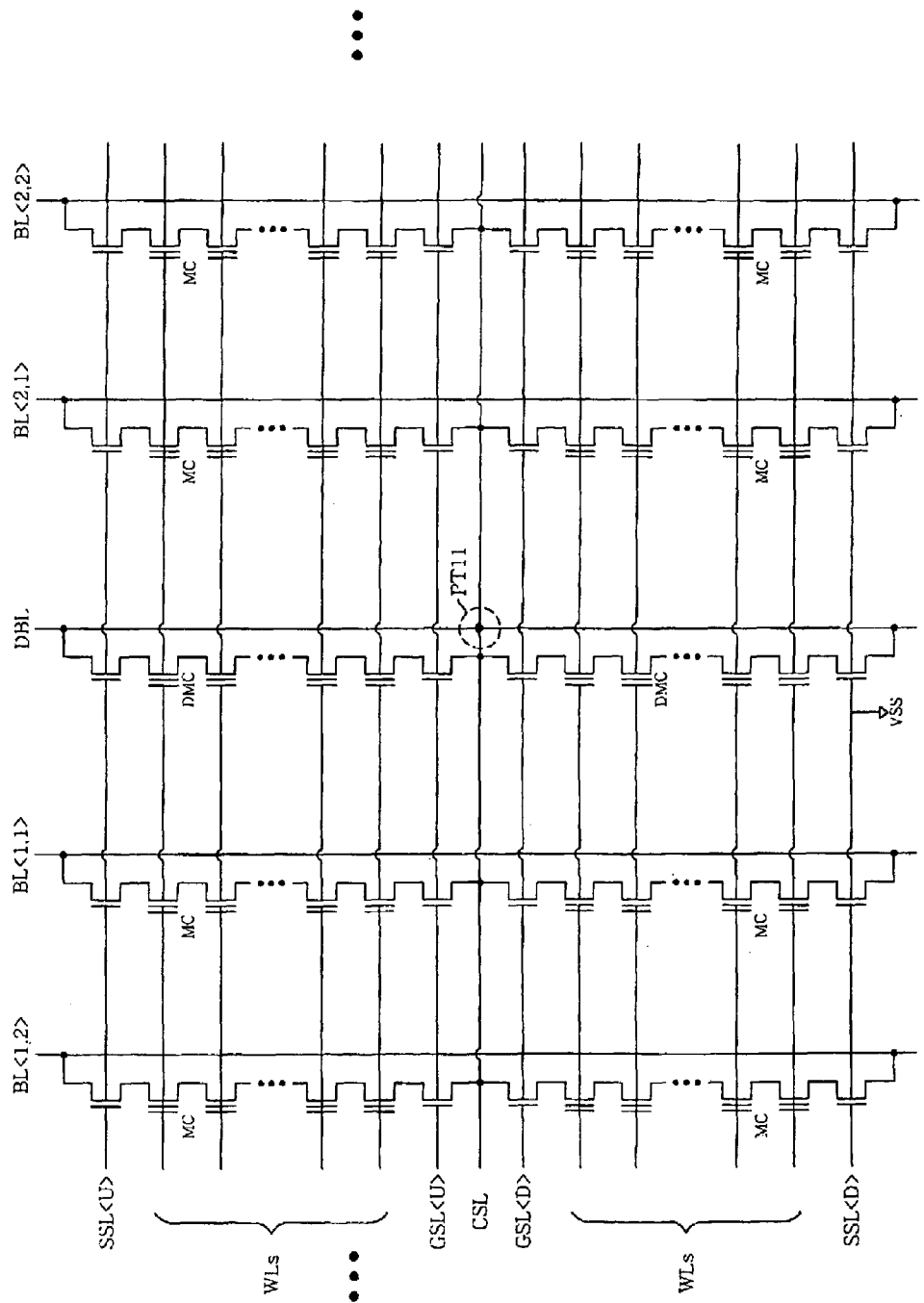
FIG. 1 is a diagram illustrating a portion of the cell array for a conventional nonvolatile semiconductor memory device.
Figure 2:
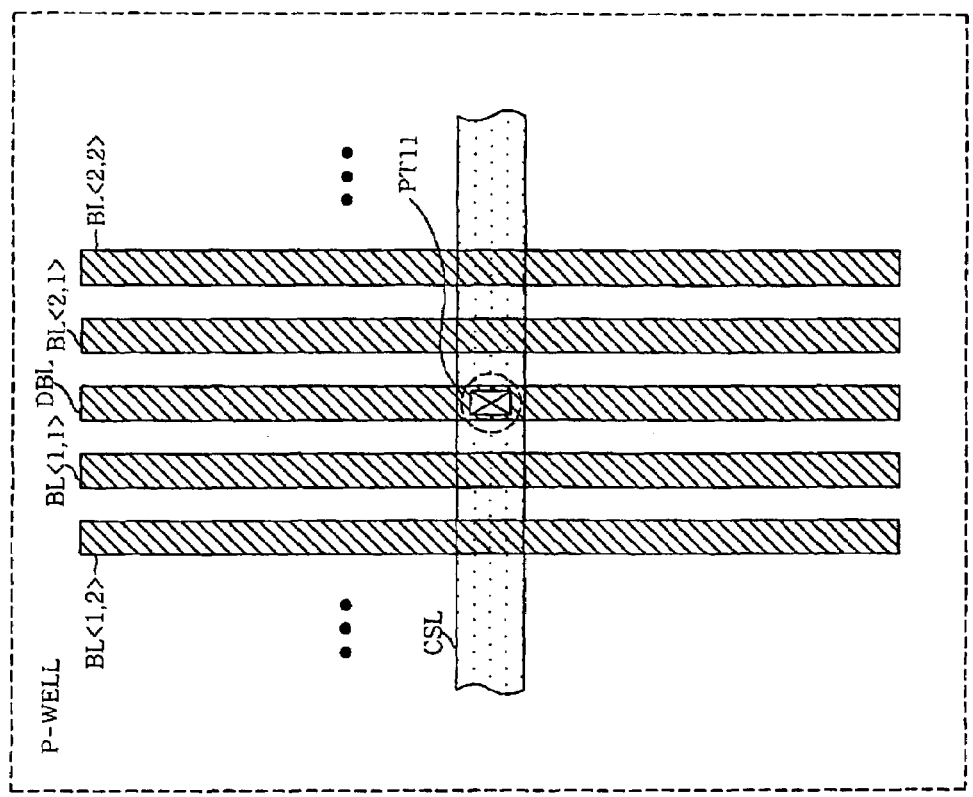
FIG. 2 is a layout further illustrating the normal bit lines, dummy bit line, and common source line of FIG. 1.
Figure 3:
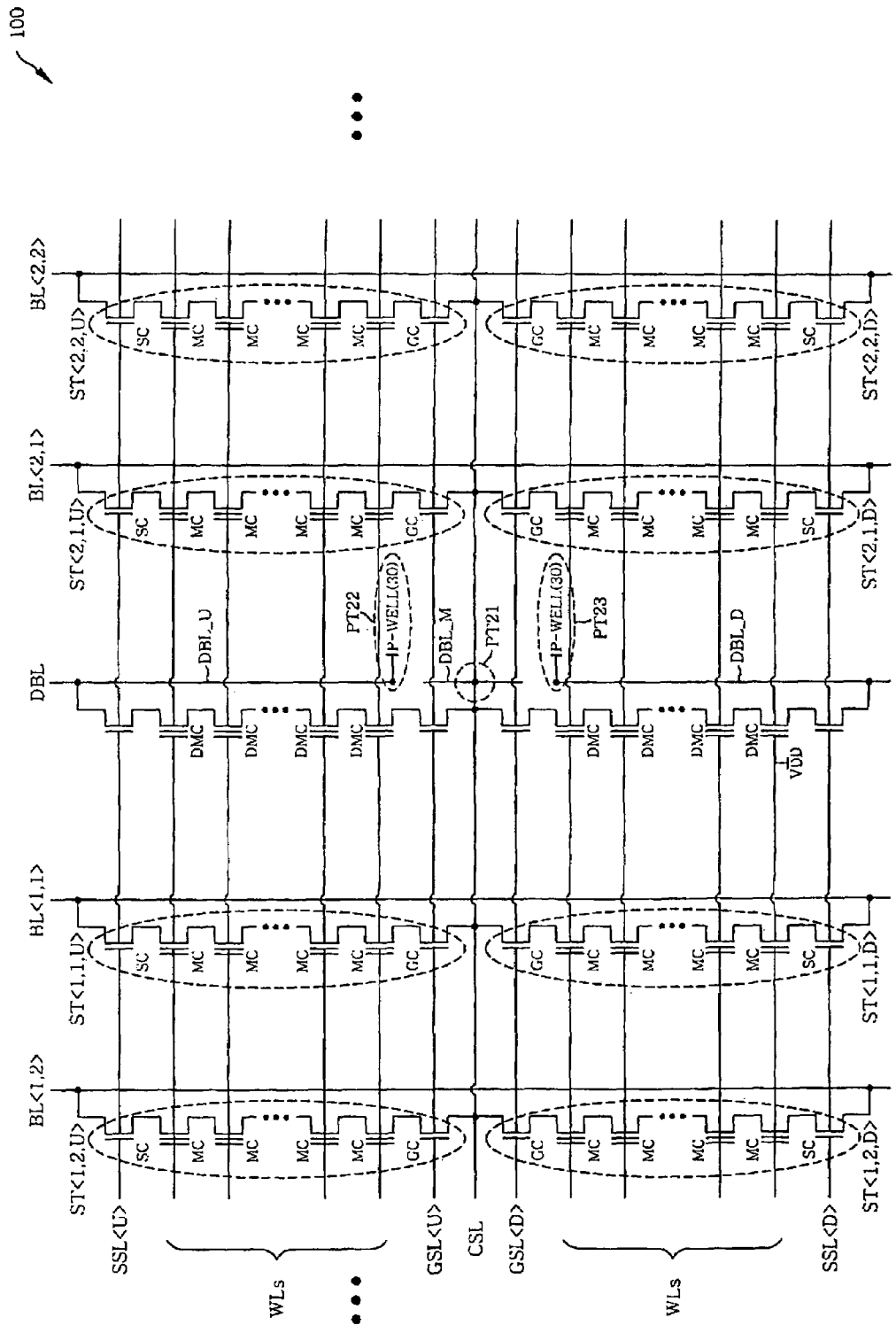
FIG. 3 is a diagram illustrating a portion of the cell array for a nonvolatile semiconductor memory device according to an embodiment of the invention.
Figure 4:
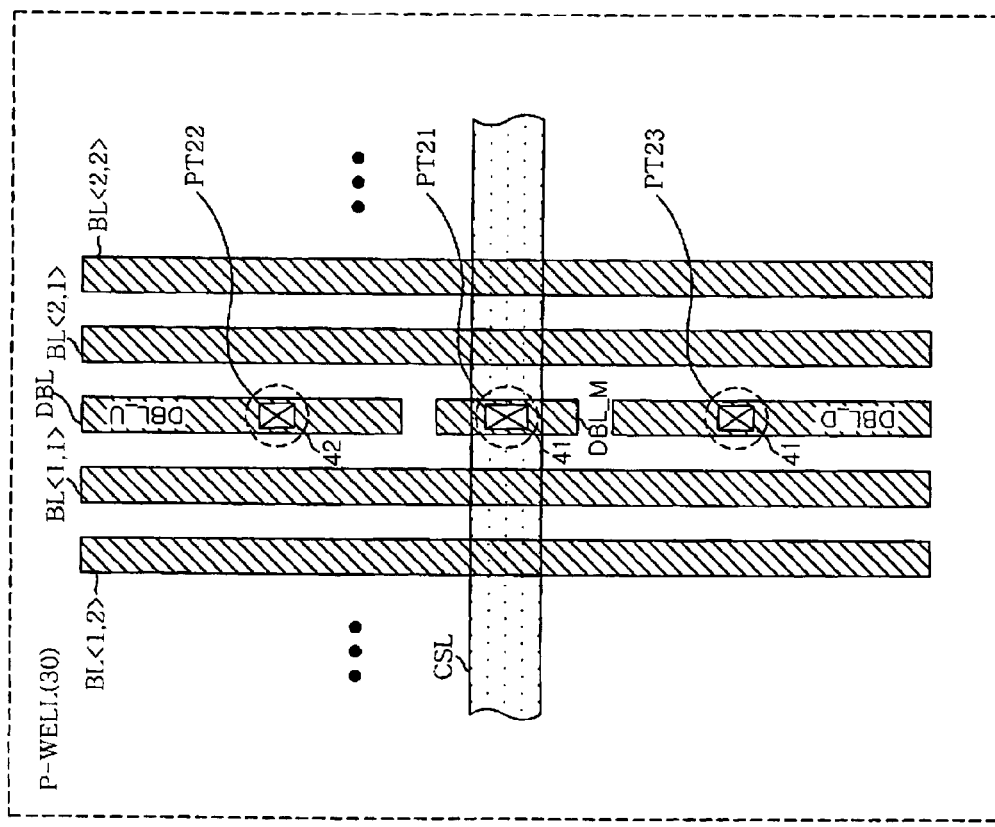
FIG. 4 is a layout further illustrating the normal bit lines, dummy bit line and common source line of FIG. 3 along with a related well region.

FIG. 3 is a diagram illustrating a portion of the memory cell array 100 for a nonvolatile semiconductor memory device according to an embodiment of the present invention. FIG. 4 is a related layout further illustrating the normal bit lines (BLs), dummy bit line (DBL), and common source line (CSL) illustrated in FIG. 3, along with an associated well region 30. The memory cell array 100 illustrated in FIG. 3 is drawn and applies to an example that assumes the use of NAND-type flash memory cells. While the present invention is not limited to only NAND-type flash memories, it has been noted that the problem of voltage level drops for normal bit lines (BLs) adjacent to a dummy bit line (DBL) during a read operation is particularly pronounced.

Referring to FIGS. 3 and 4, memory cell array 100 comprises a plurality of normal bit lines (BLs), a dummy bit line DBL and a common source line CSL. For ease of reference in FIGS. 3 and 4, only a few normal lines located on either side of a single dummy line (DBL) are shown. Those of ordinary skill in the art will recognize that FIGS. 3 and 4 are drawn to only a small, illustrative portion of a much larger memory cell array structure. In the illustrated example, the plurality of normal bit lines (BLs) are arranged parallel with the dummy bit line (DBL). The common source line (CSL) is arranged perpendicular to the normal bit lines (BLs) and the dummy bit line (DBL).

Referring now to FIG. 3, each one of the plurality of normal bit lines (BLs), is connected to a cell string (e.g., ST<Q,P,U/D>). Each cell string comprises a plurality of normal memory cells (MCs) connected in series. Each plurality of normal memory cells (MCs) is adapted to store data.

Furthermore, each cell string (ST) is electrically connected to a corresponding bit line via a string cell (SC). Each string cell SC is gated (i.e., actuated, or turned ON/OFF) by a corresponding string selection signal (SSL). Each cell string (ST) is also electrically connected to the common source line (CSL) via a ground cell (GC). Each ground cell (GC) is gated by a corresponding ground selection signal (GSL).

For ease of reference and to clearly distinguish individual normal bit lines (BLs), string selection signals (SSLs), and ground selection signals (GSLs), the illustrated circuit elements are designated using brackets (e.g., < >) and unique reference characters. For example, the reference designation ST<1,2,U> represents an upper cell string connected to a normal bit line BL<1,2>. The reference designation ST<2,1,D> represents a lower cell string connected to a normal bit line BL<2,1>.

Using the foregoing embodiment as a working example, an exemplary read operation will now be described for a nonvolatile semiconductor memory device according to the present invention. The exemplary read operation will be drawn to a method whereby data is read from a selected memory cell (MC) through its corresponding selected normal bit line (BL).

First, a read voltage (Vr) is applied to the gate of the selected memory cell MC via its corresponding word line (WL). Thus, a determination as to whether the selected memory cell (MC) is programmed in an ON-state or an OFF-state is then made in view of a relationship between the read voltage (Vr) and the selected memory cell's threshold voltage.

Where the threshold voltage is lower than the read voltage (Vr), the selected memory cell is determined to be ON. At this time, a corresponding normal bit line (BL) forms a current path to the common source line (CSL) through the cell string (ST) in which the selected memory cell MC is included. Therefore, the voltage level on the corresponding normal bit line (BL) drops below a predetermined reference voltage (Vref). (See further, FIG. 5 and the associated discussion below).

In contrast, where the threshold voltage is higher than the read voltage (Vr), the selected memory cell is determined to be OFF. At this time, the current path between the corresponding normal bit line (BL) and the common source line (CSL) is cut off. Therefore, the voltage level on the corresponding normal bit line (BL) is maintained above the predetermined reference voltage (Vref).

In the above-described example of a nonvolatile semiconductor memory device according to the present invention, the data from the selected memory cell (MC) is read in accordance with the voltage level on the corresponding normal bit line (BL). Therefore, in order to accurately read the data from the selected memory cell (MC), it is required that the corresponding normal bit line (BL) minimizes influence due to the variation of the voltage level of surrounding wiring, in particular, the dummy bit line.

Referring collectively to FIGS. 3 and 4 again, the dummy bit line (DBL) is arranged in parallel with the normal bit lines (BL). Furthermore, a plurality of dummy cells (DMCs) is connected to dummy bit line (DBL). The dummy bit line (DBL) in the illustrated example is divided into a plurality (e.g., three (3)) of dummy bit line sections (DBL_U), (DBL_M), and (DBL_D) arranged along the dummy bit line. That is, as illustrated in FIG. 3, the length of the dummy bit line (DBL), which is the sum of the lengths of the plurality of dummy bit line sections (e.g., DBL_U, DBL_M and DBL_D), is substantially the same as the length of each normal bit line (BL).

Furthermore, the center dummy bit line section (DBL_M) is electrically connected to the common source line (CSL) via a contact hole 41. The common source line (CSL) is connected to a common source voltage supply line (not shown) located above the center dummy bit line section (DBL_M).

Furthermore, the upper and lower dummy bit line sections (DBL_U and DBL_D) are electrically and respectively connected to well regions (WELL 30) via contact holes 42 and 43, as illustrated by PT22 and PT23 of FIGS. 3 and 4. In the illustrated example, the memory cells (MCs) and the dummy cells (DMCs) are located inside each well region (WELL 30). In one embodiment, the well regions (WELL 30) are P-wells, i.e., regions doped with one or more P-type impurities.

In the above-described example of a nonvolatile semiconductor memory device designed in accordance with one embodiment of the present invention, almost all of the dummy bit line sections of the dummy bit line are electrically connected to the well regions (WELL 30). The center dummy bit line section (DBL_M) which traverses the common source line (CSL) is connected to the common source line CSL.

Figure 5:
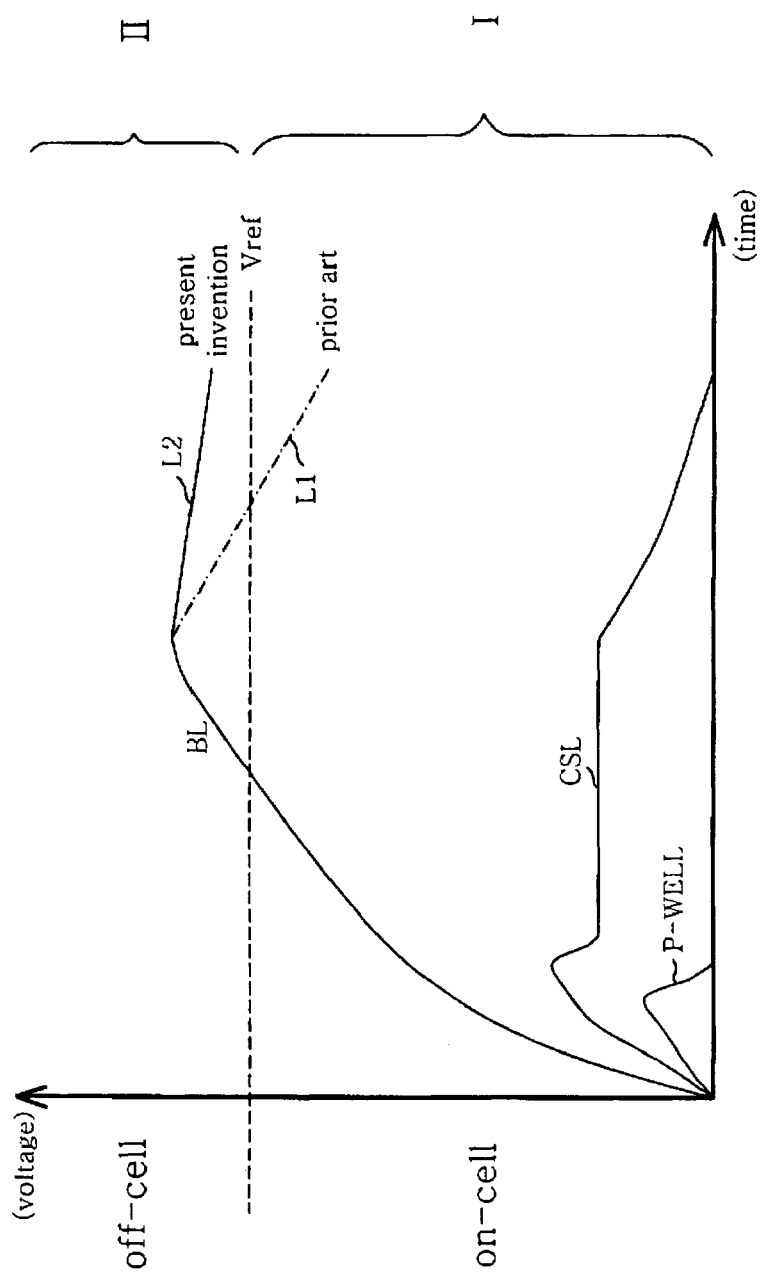
FIG. 5 is a voltage diagram illustrating the effect of one embodiment of the invention.

FIG. 5 is a voltage diagram illustrating the effect of one embodiment of the invention in relation to a conventional memory device. The voltage graph of FIG. 5 shows variation in the voltage of the normal bit line (BL) in an exemplary case where a memory cell (MC) selected during a read operation is OFF.

In FIG. 5, when the voltage level of the normal bit line (BL) drops to a region I below the predetermined voltage (Vref), the selected memory cell (MC) is determined to be in an ON-state. Furthermore, when the voltage level of the normal bit line (BL) is located in region II above the predetermined voltage (Vref), the selected memory cell (MC) is determined to be in an OFF-state.

In this case, the well region 30 very rapidly stabilized to a certain voltage (e.g., a ground voltage (VSS) in the illustrated example of FIG. 5) during the read operation, as compared with the conventionally provided common source line (CSL).

As described above, since the conventional dummy bit line (DBL) is mainly connected to the common source line (CSL), the voltage level on the common source line (CSL) drops the voltage on the normal bit line (BL) into region I as the read operation progresses, as illustrated by first line (L1) of FIG. 5. As a result, the selected memory cell may be mistakenly determined to be in an ON-state.

In contrast, in the embodiment of the invention described above, the dummy bit line (DBL) is mainly connected to the well region 30. Therefore, as the read operation progresses, the voltage level on the common source line (CSL) drops, but the voltage on the normal bit line (BL) is maintained in region II, as illustrated by second line (L2) of FIG. 5. Thus, the selected memory cell is properly determined to be in an OFF-state.

Figure 6:
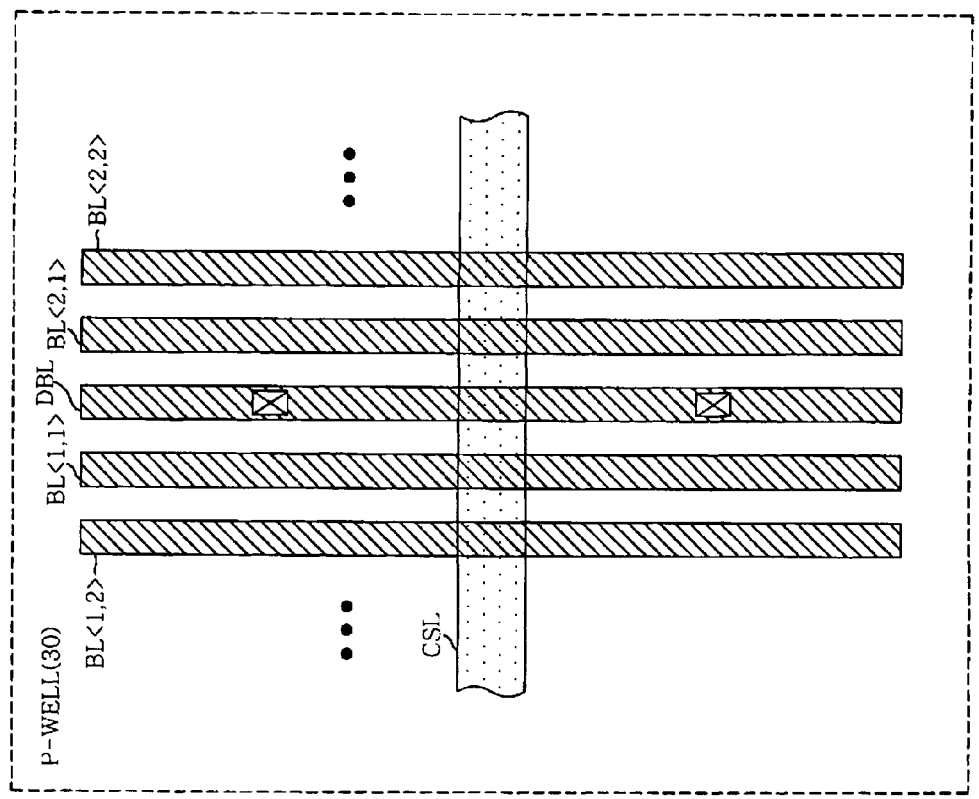
FIG. 6 is a layout illustrating normal bit lines, a dummy bit line and a common source line, along with the well region, in a portion of the cell array of a nonvolatile semiconductor memory device according to another embodiment of the invention.

It should be noted at this point that the divided (and respectively connected) nature of the dummy bit line (DBL) illustrated in FIGS. 3 and 4 is a valuable but optional feature of the invention. The dummy bit line (DBL) need not be so divided. Rather, a unitary and singularly connected dummy bit line (DBL) may be used within some embodiments of the invention. For example, as shown in FIG. 6, the common source line (CSL) may require a separate structure for connecting to a common source voltage supply line (not shown) located above the center dummy bit line section (DBL_M).

As described above, in the nonvolatile semiconductor memory device of the present invention, a dummy bit line or dummy bit line sections located adjacent to normal bit lines are mainly connected to a well region. Therefore, in the nonvolatile semiconductor memory device of the present invention, variation in voltage level of the dummy bit line or all of the dummy bit line sections due to the voltage level of the common source line considerably decreases.

Accordingly, in the nonvolatile semiconductor memory device of the present invention, the data of the selected memory cell can be stably read even from the memory cells of the normal bit lines adjacent to the dummy bit line.

Although the present invention has been described with reference to the embodiments illustrated in the drawings, the embodiments are merely exemplary and those skilled in the art will appreciate that various modifications and other equivalent embodiments are possible.

For example, in the foregoing example, the embodiments, the entire dummy bit line or dummy bit line sections are electrically connected to a corresponding well region. However, it will be apparent to those skilled in the art that other embodiments of the invention may be implemented in which the entire dummy bit line or a part of dummy bit line sections are connected to a power supply line which guides a power supply voltage (e.g., VCC) having a stable voltage, or a ground line which guides a ground voltage (e.g., VSS).

Furthermore, three dummy bit line sections (DBL_U, DBL_M and DBL_D) are illustrated in FIGS. 3 and 4. However, it is merely exemplary, and the dummy bit line (DBL) may be divided into four or more dummy bit line sections.

Although several embodiments of the invention have been disclosed for illustrative purposes, those skilled in the art will appreciate that various modifications, additions and substitutions are possible, without departing from the scope of the invention as disclosed in the accompanying claims.

What is claimed is:

1. A nonvolatile semiconductor memory device, comprising:
a plurality of normal bit lines, each connecting normal memory cells;
a dummy bit line arranged in parallel with the plurality of normal bit lines and connecting dummy cells, the dummy bit line comprising first and second dummy bit line sections, wherein the first and second dummy bit line sections are not electrically connected one to another;
a common source line arranged to traverse the plurality of normal bit lines and the dummy bit line, and connected to the first dummy bit line section; and
a well region formed proximate the normal memory cells and the dummy cells;
wherein the second dummy bit line section is connected to the well region.

2. The nonvolatile semiconductor memory device of claim 1, wherein the well region comprises one or more P-type impurities.

3. The nonvolatile semiconductor memory device of claim 1, wherein the first dummy bit line section connected to the common source line is laid out to traverse the common source line.

4. The nonvolatile semiconductor memory device of claim 1, wherein the nonvolatile semiconductor memory device comprises a NAND-type flash memory.

5. A nonvolatile semiconductor memory device, comprising:
a plurality of normal bit lines, each connecting normal memory cells;
a dummy bit line arranged in parallel with the plurality of normal bit lines and connecting dummy cells, wherein the dummy bit line comprises an upper dummy bit line section, a lower dummy bit line section, and a middle dummy bit line section arranged between the upper and lower dummy bit line sections, and the upper and lower dummy bit line sections are not electrically connected to the middle dummy bit line section;
a common source line arranged to traverse the plurality of normal bit lines and the dummy bit line; and
a well region formed proximate the normal memory cells and the dummy cells;
wherein the upper and lower dummy bit line sections are electrically connected to at least one of a power supply line, a ground voltage line, and the well region, and the middle dummy bit line section is electrically connected to the common source line.

6. The nonvolatile semiconductor memory device of claim 5, wherein the well region comprises one or more P-type impurities.

7. The nonvolatile semiconductor memory device of claim 5, wherein the nonvolatile semiconductor memory device comprises a NAND-type flash memory.

* * * * *